(12) United States Patent
Komatsu et al.

(10) Patent No.: US 12,267,964 B2
(45) Date of Patent: Apr. 1, 2025

(54) ELECTRONIC COMPONENT MODULE AND METHOD FOR MANUFACTURING ELECTRONIC COMPONENT MODULE

(71) Applicant: Murata Manufacturing Co., Ltd., Nagaokakyo (JP)

(72) Inventors: Toru Komatsu, Nagaokakyo (JP); Tadashi Nomura, Nagaokakyo (JP)

(73) Assignee: MURATA MANUFACTURING CO., LTD., Kyoto-fu (JP)

( * ) Notice: Subject to any disclaimer, the term of this patent is extended or adjusted under 35 U.S.C. 154(b) by 204 days.

(21) Appl. No.: 18/184,728

(22) Filed: Mar. 16, 2023

(65) Prior Publication Data

US 2023/0217599 A1 Jul. 6, 2023

Related U.S. Application Data

(63) Continuation of application No. PCT/JP2021/034923, filed on Sep. 24, 2021.

(30) Foreign Application Priority Data

Sep. 25, 2020 (JP) ................. 2020-160701

(51) Int. Cl.
*H05K 1/18* (2006.01)
*H05K 3/00* (2006.01)
(Continued)

(52) U.S. Cl.
CPC ............. *H05K 3/305* (2013.01); *H05K 1/181* (2013.01); *H05K 3/0052* (2013.01);
(Continued)

(58) Field of Classification Search
CPC .................... H05K 1/181; H05K 2201/10977
See application file for complete search history.

(56) References Cited

U.S. PATENT DOCUMENTS

| 2010/0027225 | A1  | 2/2010 | Yuda et al. |
| 2011/0006106 | A1* | 1/2011 | Kanryo ................. H01L 25/165 228/170 |

(Continued)

FOREIGN PATENT DOCUMENTS

| JP | H08-64761 A | 3/1996 |
| JP | 2003-249580 A | 9/2003 |

(Continued)

OTHER PUBLICATIONS

International Search Report for PCT/JP2021/034923 dated Nov. 16, 2021.

*Primary Examiner* — Sherman Ng
(74) *Attorney, Agent, or Firm* — McDonald Hopkins LLC

(57) ABSTRACT

An electronic component module includes a plurality of components having terminals and arranged along a plane, a sealing resin portion that covers and seals these components and has a plane as one plane of an outer surface, and a shield layer that covers the outer surface of the sealing resin portion. Terminals of the plurality of components are exposed in a state of protruding from the plane of the sealing resin portion, and the terminals of these components protruding from the plane of the sealing resin portion are used as mounting terminals of the electronic component module.

12 Claims, 8 Drawing Sheets

(51) Int. Cl.
*H05K 3/30* (2006.01)
*H05K 3/34* (2006.01)

(52) U.S. Cl.
CPC . *H05K 3/3478* (2013.01); *H05K 2201/10007* (2013.01); *H05K 2201/10977* (2013.01); *H05K 2203/0228* (2013.01); *H05K 2203/0264* (2013.01)

(56) References Cited

U.S. PATENT DOCUMENTS

| | | | |
|---|---|---|---|
| 2012/0320536 A1* | 12/2012 | Yamamoto | H01L 21/561 361/728 |
| 2016/0351509 A1 | 12/2016 | Dang et al. | |
| 2017/0092633 A1 | 3/2017 | Tomonari et al. | |
| 2018/0197822 A1 | 7/2018 | Sawamoto et al. | |
| 2019/0230781 A1* | 7/2019 | Onodera | H05K 1/165 |

FOREIGN PATENT DOCUMENTS

| | | |
|---|---|---|
| JP | 2017-022167 A | 1/2017 |
| JP | 2017-063123 A | 3/2017 |
| WO | 2008/136251 A1 | 11/2008 |
| WO | 2018/084143 A1 | 5/2018 |

* cited by examiner

[COMPONENT ALIGNMENT STEP]

[RESIN SEALING STEP]

[PRINTING STEP]

[SHEET PEELING STEP]

[SEPARATION STEP]

[CONDUCTOR LAYER FORMATION STEP]

ELECTRONIC COMPONENT MODULE AND METHOD FOR MANUFACTURING ELECTRONIC COMPONENT MODULE

CROSS REFERENCE TO RELATED APPLICATION

This is a continuation of International Application No. PCT/JP2021/034923 filed on Sep. 24, 2021 which claims priority from Japanese Patent Application No. 2020-160701 filed on Sep. 25, 2020. The contents of these applications are incorporated herein by reference in their entireties.

BACKGROUND OF THE DISCLOSURE

Field of the Disclosure

The present disclosure relates to an electronic component module including a plurality of components and a method for manufacturing the same.

Description of the Related Art

Patent Literature 1 discloses a hybrid IC that is thinner and lighter than conventional hybrid ICs and has fewer connection points by eliminating a wiring substrate in the hybrid IC. In this hybrid IC, electrodes of a plurality of electronic components are fixed at positions conforming to a predetermined wiring pattern in a state in which the electrodes are exposed on the same plane by resin, and solder bumps are formed at electrode portions of the plurality of electronic components. These solder bumps are provided in a state where a part of a bottom surface portion of, for example, a chip resistor, a chip capacitor, a chip transistor, a chip diode, or the like is exposed slightly.

Patent Literature 1

Japanese Patent Unexamined Publication No. 8-64761 bulletin

BRIEF SUMMARY OF THE DISCLOSURE

In the hybrid IC described in Patent Literature 1, the solder bumps are disposed on the same plane on the electrodes of the electronic component exposed from the resin, and a part of the bottom surface of the electronic component is disposed in a state of being slightly exposed from the resin. Therefore, there is a risk that solder bonding quality is deteriorated due to solder mounting on the planar electrode of the mounting substrate, and there is a risk that sufficient cleanability and resin filling properties cannot be obtained if the gap between the mounting substrate and the hybrid IC is narrow. In addition, each component is only covered with resin, and has no shielding property.

Therefore, a possible benefit of the present disclosure is to provide an electronic component module in which terminals of a plurality of components are reliably exposed and mountability to a mounting substrate and reliability of a mounting portion are improved, and a method for manufacturing such an electronic component module.

An electronic component module as one example of the present disclosure includes: a plurality of components having terminals and arranged along a plane; a sealing resin portion that covers and seals the plurality of components and has the plane as one plane of an outer surface; and a shield conducting film that covers the outer surface of the sealing resin portion. The plurality of components include a chip component, the chip component includes a terminal at at least one end portion of a main body that constitutes a component main body, at least a part of the end portion protrudes from the sealing resin portion, at least a part of the terminal protrudes from the sealing resin portion, and the at least a part of the end portion and the terminal protruding from the plane of the sealing resin portion is used as a mounting terminal of the electronic component module.

With the above structure, at least one terminal of the chip component included in the plurality of components is exposed in a state of protruding from the plane of the sealing resin portion. Therefore, the terminal protrudes at a height suitable for bonding by soldering or the like, and the terminal can be used as a terminal of the electronic component module.

A method for manufacturing an electronic component module as one example of the present disclosure includes: a component alignment step of aligning a plurality of components each having a terminal with an adhesive sheet; a resin sealing step of resin-sealing a periphery of the plurality of components on the adhesive sheet to form a sealing resin portion; an adhesive sheet peeling step of peeling the adhesive sheet from the sealing resin portion and causing at least a part of the end portions and the terminal of the plurality of components to protrude to a surface from which the adhesive sheet has been peeled off; a separation step of cutting and separating the sealing resin portion into individual pieces; and a conductor film formation step of forming a shield conducting film on a surface of the sealing resin portion.

According to the above method for manufacturing, the terminal of the plurality of components can be easily protruded from the plane of the sealing resin portion.

According to the present disclosure, it is possible to obtain an electronic component module having high mountability to a mounting substrate and high reliability of a mounting portion are improved.

DETAILED DESCRIPTION OF THE DISCLOSURE

Hereinafter, a plurality of modes for carrying out the present disclosure will be described with some specific examples with reference to the drawings. In each figure, the same parts are designated by the same reference signs. In consideration of the description of the main points or ease of understanding, the embodiment is divided into a plurality of embodiments for convenience of description, but partial replacement or combination of configurations shown in different embodiments is possible. In second and subsequent embodiments, description of matters common to a first embodiment will be omitted, and only different points will be described. In particular, similar actions and effects obtained by the same configuration will not be sequentially described for each embodiment.

First Embodiment

Figure 1A:
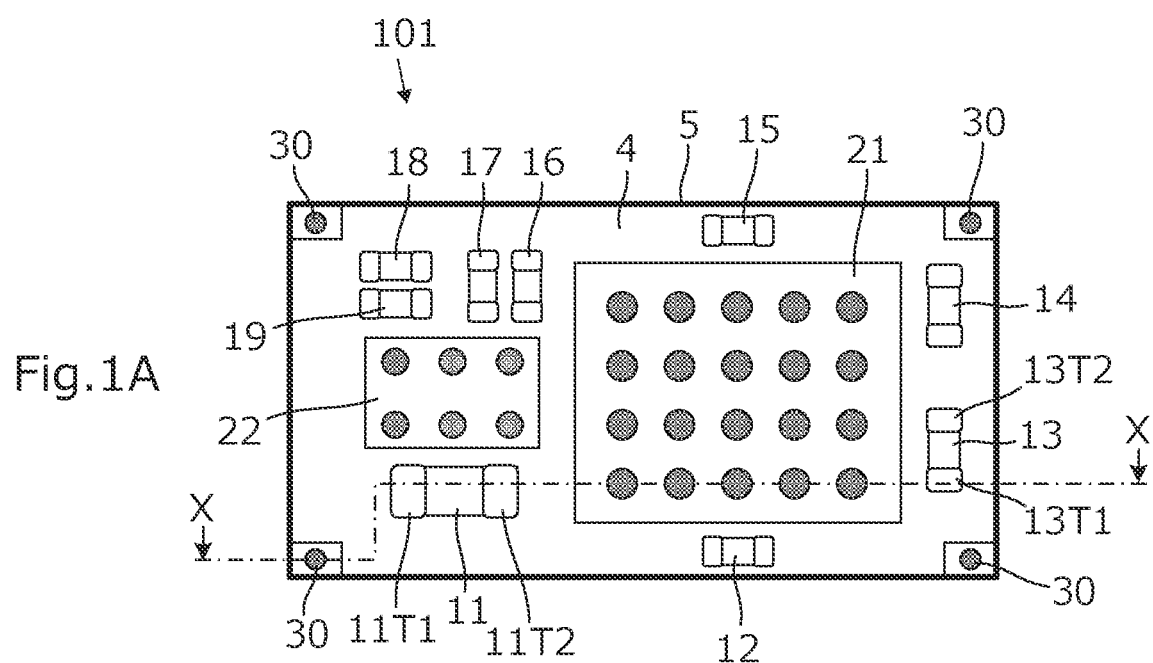
FIG. 1A is a plan view of an electronic component module 101 according to a first embodiment.
Figure 1B:
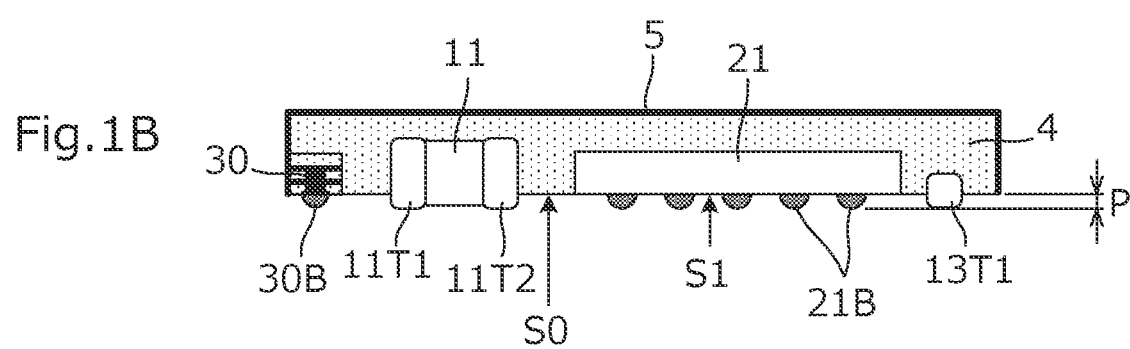
FIG. 1B is a longitudinal sectional view taken along line X-X in FIG. 1A.
Figure 1C:
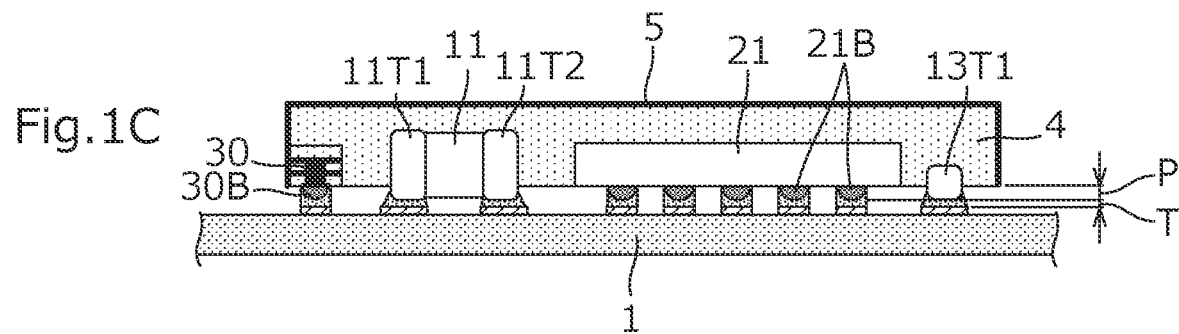
FIG. 1C is a longitudinal sectional view taken along line X-X in FIG. 1A showing the electronic component module mounted on a mounting substrate 1.

FIG. 1A is a plan view of an electronic component module 101 according to the first embodiment, and FIG. 1B is a longitudinal sectional view taken along line X-X in FIG. TA. However, in FIG. 1B, illustration of a cross-sectional pattern is omitted for portions other than a sealing resin portion 4. The same applies to cross-sectional views that are shown later. FIG. 1C is a cross-sectional view of the electronic component module 101 mounted on a mounting substrate 1.

The electronic component module 101 includes a plurality of components each having a terminal, the sealing resin portion 4 that covers and seals the components, and a shield layer 5 that covers an outer surface of the sealing resin portion 4.

The plurality of components includes chip components 11 to 19, bump components 21 and 22, and a conductive component 30. Each of the chip components 11 to 19 is a component in which terminals are provided at both ends. The bump components 21 and 22 are components in which a plurality of bumps as the terminals are disposed on a bump forming surface S1. The conductive component 30 is a component that is conducted to the shield layer 5. Examples of the chip components 11 to 19 include a chip resistor, a chip capacitor, a chip inductor, a ceramic filter, and the like, and examples of the bump components 21 and 22 include a surface acoustic wave filter, a bulk acoustic wave filter, a semiconductor chip, an integrated passive device, and the like. The conductive component 30 is a component cut out from a multilayer substrate having a copper pattern. Alternatively, the conductive component 30 may be a copper chip or a block terminal.

More specifically, the chip component 11 includes a main body that constitutes a component main body and that is in a rectangular parallelepiped shape having six surfaces. For example, the terminals of the chip component 11 are respectively provided at two ends of the main body (corresponding to a "first terminal" and a "second terminal" of the present disclosure). The end portion of the main body of the chip component 11 refers to a region including one surface and a part of four surfaces communicating with the one surface.

The terminals of the chip component 11 are provided on at least a part of the end portion including the end portion protruding from the sealing resin portion 4. It is assumed that an end portion of the chip component 11 protruding from the sealing resin portion 4 is provided with a terminal.

Note that a plurality of independent terminals may be formed at each of end portions of the chip component 11. In addition, the terminals may be formed only at one end portion, or individual terminals may be respectively provided at three or more end portions.

The terminals of the plurality of components protrude and are exposed in a state of protruding from a plane S0 of the sealing resin portion 4 along with the end portion protruding from the sealing resin portion 4. P illustrated in FIG. 1B is an amount of protrusion of the terminals of the plurality of components protruding from the plane S0 of the sealing resin portion 4. The terminals of the plurality of components protruding from the plane S0 of the sealing resin portion 4 are directly used as mounting terminals of the electronic component module 101. As shown in FIG. 1C, the electronic component module 101 is mounted on the mounting substrate 1 at a height obtained by adding a bonding portion thickness T to a protrusion amount P.

The shield layer 5 is a metal film formed by sputtering, plating, or the like, and may be configured by stacking metals of a plurality of kinds. The shield layer 5 has, for example, a three-layer structure of a cohesive layer, a conductive layer, and a rust-prevention layer in this order from the sealing resin portion 4. Roles and characteristics of these layers are as follows.

[Cohesive Layer]
Bringing the shield layer 5 into close contact with the sealing resin portion 4.
A layer thickness of the cohesive layer is thinner than a film thickness of the conductive layer. For example, Ti, Cr, stainless steel (SUS), or the like can be used.

[Conductive Layer]
Shielding the electromagnetic interference wave.
Configured by a metal having high conductivity, and a layer thickness is thicker than the cohesive layer and the rust-prevention layer (shielding performance is determined by the conductive layer). For example, copper (Cu), silver (Ag), aluminum (Al), or the like can be used.

[Rust-Prevention Layer]
Preventing oxidation or corrosion of the conductive layer.
A layer thickness of the rust-prevention layer is several nm to several hundred μm, and is thinner than the film thickness of the conductive layer. For example, Ti, Cr, stainless steel (SUS), or the like can be used.

Next, a method for manufacturing the electronic component module 101 will be exemplified.

Figure 2:
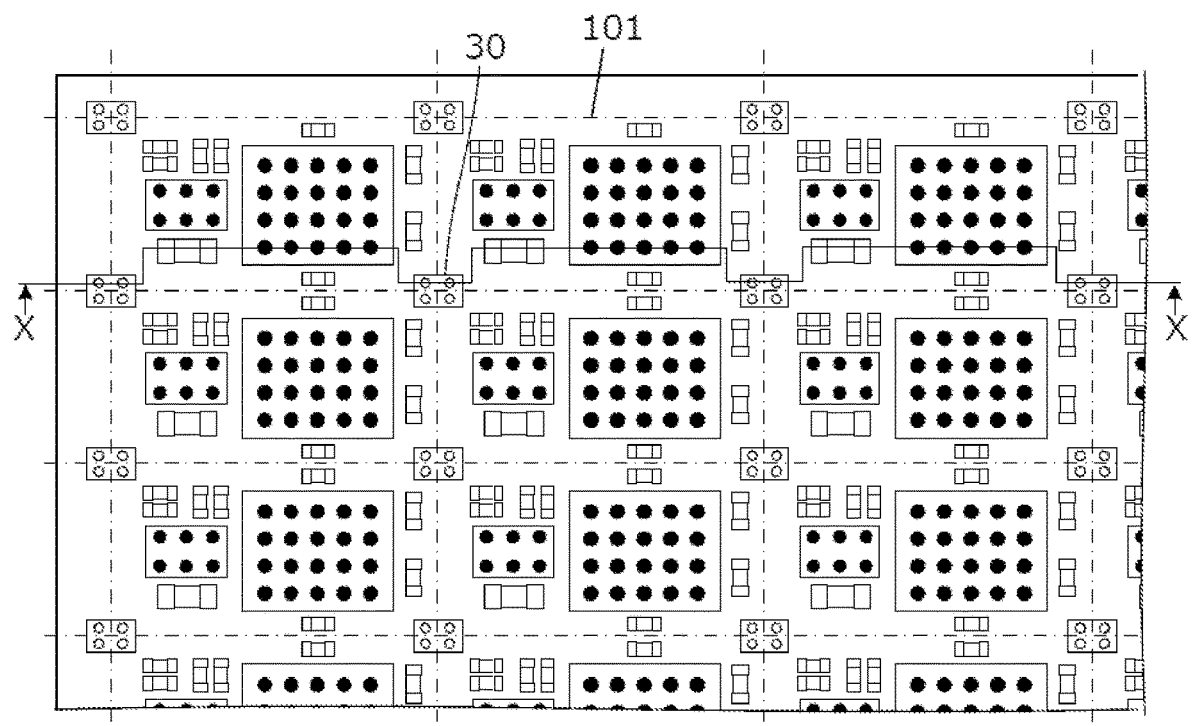
FIG. 2 is a plan view of a mother board in a mother board stage before separation into individual pieces.

FIG. 2 is a partial plan view of a mother board in a mother board stage before separation into individual pieces that will be described later.

Alternate long and short dash lines in FIG. 2 is a cutting line of the motherboard, and a separated electronic component module 101 is obtained by cutting along the alternate long and short dash lines. As illustrated in FIG. 2, conductive component 30 are disposed at positions cut by lateral and longitudinal alternate long and short dash lines. By cutting these conductive components 30 laterally and longitudinally, the conductive components 30 are formed at the four corners of the electronic component module 101.

Figure 3A:
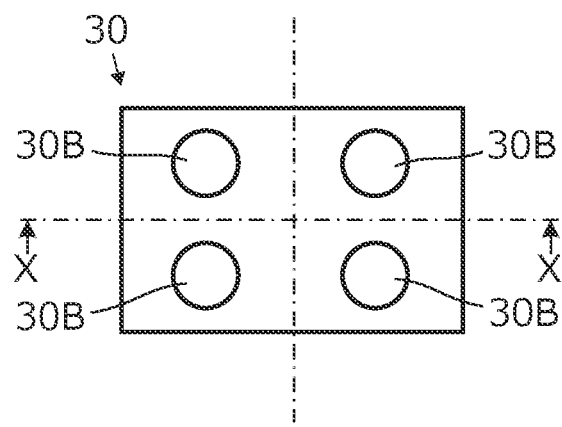
FIG. 3A is a plan view of a conductive component 30.
Figure 3B:
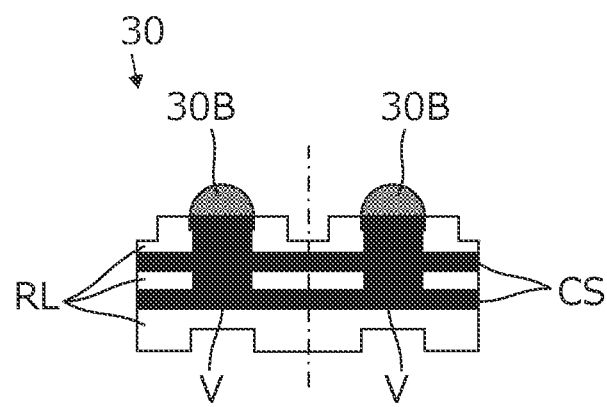
FIG. 3B is a cross-sectional view of the conductive component 30 taken along line X-X in FIG. 3A.

FIG. 3A is a plan view of the conductive component 30, and FIG. 3B is a cross-sectional view of the conductive component 30 taken along line X-X in FIG. 3A. The conductive component 30 includes a stacking body of an insulator layer RL and a copper foil layer CS, a via conductor V, and a solder bump 30B. A stacking body is constituted by the insulator layer RL and the copper foil layer CS, the via conductor V is provided for the stacking body, and the solder bump 30B is further provided on an outer surface of the via conductor.

Figure 4:
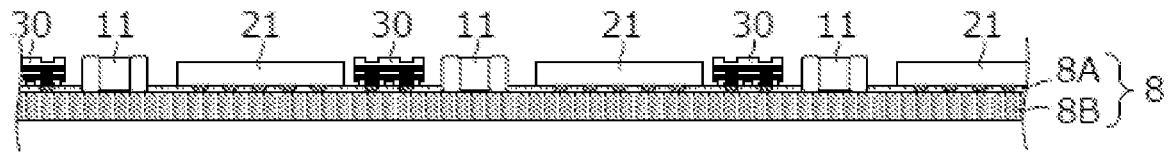
FIG. 4 is a cross-sectional view showing steps of a method for manufacturing the electronic component module 101.
Figure 4:
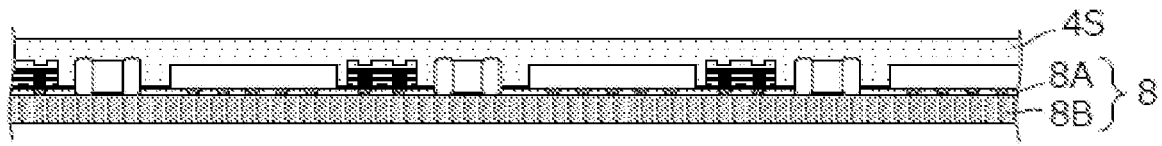
Figure 4:
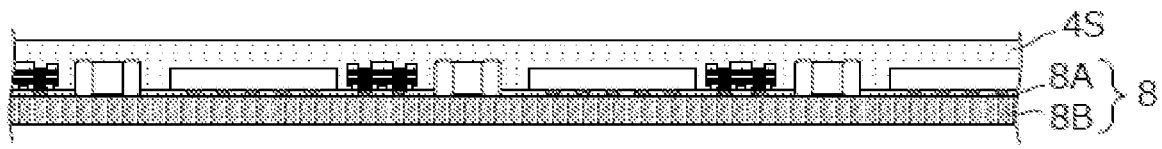
Figure 4:
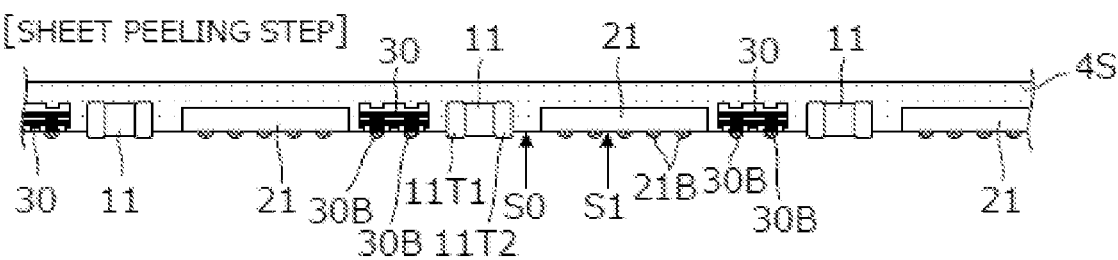
Figure 4:
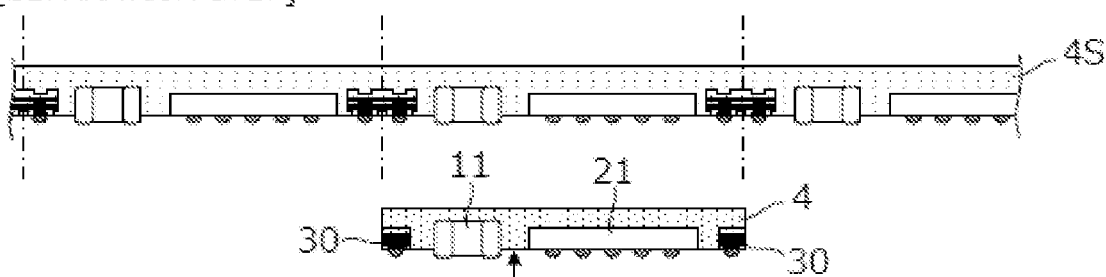
Figure 4:
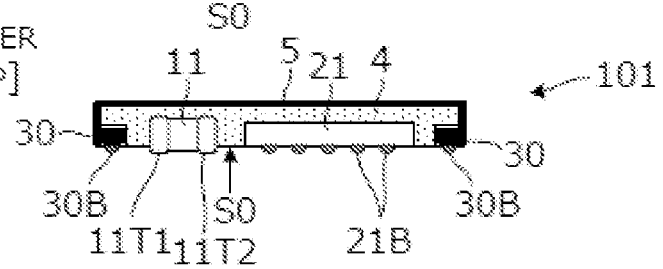

FIG. 4 is a cross-sectional view showing steps of a method for manufacturing the electronic component module 101. Each of the steps will be described with reference to FIG. 4.

[Component Alignment Step]

A plurality of predetermined components are aligned on an adhesive sheet 8. The adhesive sheet 8 includes a base material 8B and an adhesive layer 8A covering a surface of the base material 8B. The base material 8B is, for example, a polyimide sheet, a metal foil, or a plate of aluminum, copper, or the like, and the adhesive layer 8A is, for example, an acrylic resin, polyvinyl alcohol, or the like.

When the chip component 11 is placed on the adhesive sheet 8, the chip component 11 pushes out the adhesive layer 8A and sinks into the adhesive layer 8A such that a distance between a bottom surface of the chip component 11 and the base material 8B becomes a predetermined interval (protrusion amount P shown in FIG. 1B). When the bump component 21 is placed on the adhesive sheet 8, the solder bumps are buried in the adhesive layer 8A, and the bump forming surface (S1 shown in FIG. 1B) of the bump component is in contact with a surface of the adhesive layer 8A. Similarly, when the conductive component 30 is placed on the adhesive sheet 8, the solder bump of the conductive component 30 is buried in the adhesive layer 8A.

[Resin Sealing Step]

The adhesive sheet 8 is coated with a sealing resin layer 4S. Thus, the periphery of the plurality of components on the adhesive sheet 8 is resin-sealed with the sealing resin layer 4S. The sealing resin layer 4S is an epoxy-based resin, for example, and is coated by a method such as compression molding or dispenser coating. Thereafter, the sealing resin layer 4S is solidified to become the sealing resin portion 4.

[Printing Step]

As appropriate, information regarding the electronic component module is printed on an upper surface of the sealing resin portion 4.

[Sheet Peeling Step]

The adhesive sheet 8 is peeled off from the sealing resin portion 4. As a result, the terminals of the plurality of components are exposed on the surface of the sealing resin portion 4 from which the adhesive sheet 8 is peeled off. In this state, terminals 11T1 and 11T2 of the chip component 11 are exposed in a protruding state. Further, a solder bump 21B of the bump component 21 is exposed in a protruding state. The bump forming surface S1 of the bump component 21 is flush with the plane S0 of the sealing resin portion 4. Similarly, for the conductive component 30, the solder bump 30B is exposed in a protruding state.

[Separation Step]

The sealing resin portion 4 and the conductive component 30 are cut and separated into individual pieces of electronic component modules.

[Conductor Layer Formation Step]

The shield layer 5 is formed on five surfaces (upper surface and four side surfaces) other than the plane S0 of each piece of the sealing resin portion 4. First, for example, SUS is formed as the cohesive layer on the surface of the sealing resin portion 4 by sputtering. Next, for example, copper is formed as the conductive layer on the surface of the cohesive layer by sputtering. Further, for example, SUS is formed as the rust-prevention layer on the surface of the conductive layer by sputtering.

Note that, here, the example in which the shield layer 5 is formed after the separation has been described, but the shield layer may be formed before the separation, and the separation may be performed last.

Through the above steps, the electronic component module 101 is manufactured.

In the present embodiment, the plane S0 of the sealing resin portion 4 is a rectangle, and when the rectangle is divided into four equal parts laterally and longitudinally, some of the terminals of the plurality of components exist in at least two of the divided parts. This will be described with reference to FIG. 5.

Figure 5:
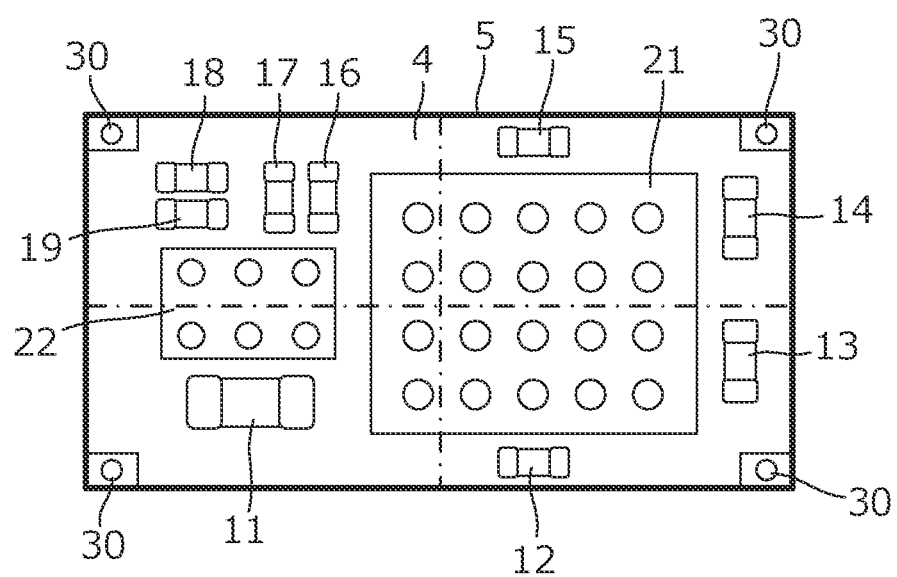
FIG. 5 is a diagram showing the electronic component module 101 shown in FIG. 1A overlapped with lines indicating sections four equal parts.

FIG. 5 is a diagram showing the electronic component module 101 shown in FIG. 1A overlapped with lines indicating the four equal parts. In the present embodiment, the plane S0 of the sealing resin portion 4 is a rectangle, and when the rectangle is divided into four equal parts laterally and longitudinally, the terminals of the plurality of components exist in all of the divided parts. For example, in FIG. 5, the terminals of the chip component 11 and the conductive component 30 exist in a lower left part, the terminals of the chip components 16, 17, 18, and 19 and the conductive component 30 exist in an upper left part, one of the terminals of the chip component 15, one of the terminals of the chip component 14, a part of the solder bumps of the bump component 21, and the conductive component 30 exist in an upper right section, and one of the terminals of the chip component 13, one of the terminals of the chip component 12, a part of the solder bumps of the bump component 21, and the conductive component 30 exist in a lower right section.

FIG. 5 illustrates the example in which the terminals of the plurality of components exist in all of the four equal parts of the plane S0 of the sealing resin portion 4. However, a structure in which some terminals of one or more components exist in at least two parts may be adopted.

As described above, when the plane S0 of the sealing resin portion 4 is divided into the four equal parts laterally and longitudinally, some of the terminals of one or more components exist in at least two of the divided parts, and therefore when the electronic component module 101 is mounted on a mounting substrate, a gap between the plane S0 of the electronic component module 101 and the mounting substrate is appropriately maintained over the entire surface.

According to the present embodiment, the following effects are obtained.

(1) Since terminals of the plurality of components such as the chip components 11 and 12, the bump components 21 and 22, and the conductive component 30 are exposed in a state of protruding from the plane S0 of the sealing resin portion 4, the terminals of the plurality of components are reliably exposed. Thus, the terminals of these components can be directly used as the mounting electrodes of the electronic component module 101. Therefore, it is possible to obtain the same mountability and reliability as mounting of each component separately.

(2) Compared to an electronic component module having a structure in which a plurality of components are mounted on an interposer and an upper portion of the interposer is resin-sealed, an interposer is unnecessary, and thus the entire electronic component module can be made thinner.

(3) A shield region can be provided within a product by mounting on the mounting substrate in the product together with other components.

(4) Since the gap between the plane S0 of the electronic component module 101 and the mounting substrate is appropriately maintained over the entire surface, solder bonding quality of solder mounting on an electrode of the mounting substrate is high.

(5) Since the gap between the mounting substrate and the electronic component module 101 is appropriately maintained, the gap between the mounting substrate and the electronic component module 101 can be sufficiently cleaned.

(6) Since the gap between the mounting substrate and the electronic component module 101 is appropriately maintained, the resin filling property is high when the gap between the mounting substrate and the electronic component module 101 is filled with a resin.

Second Embodiment

In the second embodiment, an electronic component module including a module component will be exemplified.

Figure 6:
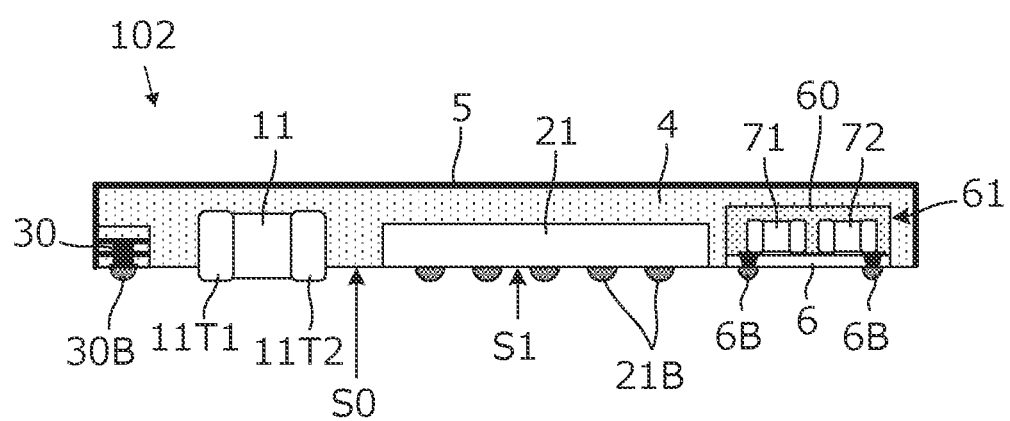
FIG. 6 is a front cross-sectional view of an electronic component module 102 according to a second embodiment.

FIG. 6 is a front cross-sectional view of an electronic component module 102 according to the second embodiment. The electronic component module 102 includes a plurality of components each having a terminal, the sealing resin portion 4 that covers and seals the components, and the shield layer 5 that covers an outer surface of the sealing resin portion 4.

The electronic component module 102 is different from the electronic component module 101 of the first embodiment shown in FIGS. 1A and 1B in that a module component 61 is provided. The module component 61 includes a module board 6, chip components 71 and 72 mounted on the module board 6, and a sealing resin 60 for sealing the chip components 71 and 72 on the module board 6. Solder bumps 6B are formed on electrodes of the module board 6.

Other configurations are the same as the configurations shown in the first embodiment. As described above, the component included in the electronic component module is not limited to a single component such as a chip component or a bump component, and may be a module component.

Third Embodiment

In the third embodiment, an electronic component module in which one end portion of a chip component having terminals disposed at both end portions is exposed in a state of protruding from a sealing resin portion including the terminals will be exemplified. Further, an electronic component module including a module component will also be exemplified.

Figure 7:
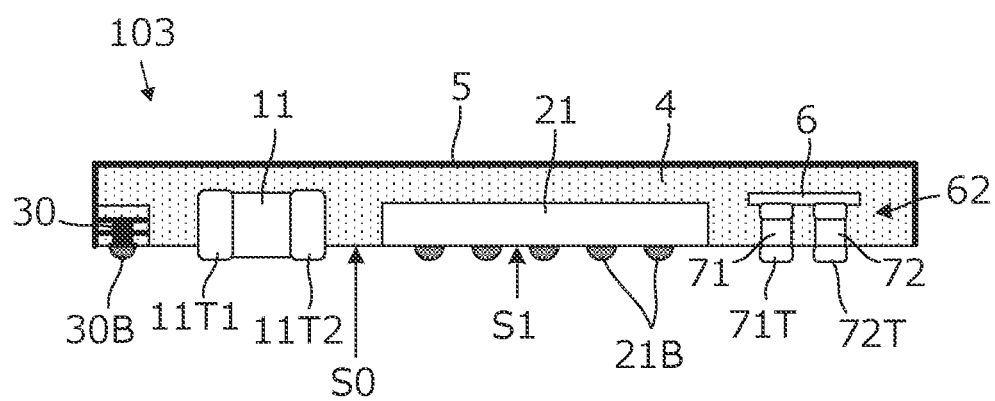
FIG. 7 is a front cross-sectional view of an electronic component module 103 according to a third embodiment.

FIG. 7 is a front cross-sectional view of an electronic component module 103 according to a third embodiment. The electronic component module 103 includes a plurality of components each having a terminal, the sealing resin portion 4 that covers and seals the components, and the shield layer 5 that covers an outer surface of the sealing resin portion 4.

The electronic component module 103 is different from the electronic component module 101 of the first embodiment shown in FIGS. 1A and 1B in that a module component 62 is provided. The module component 62 includes a module board 6 and chip components 71 and 72 mounted on the module board 6. The chip components 71 and 72 are arranged such that terminals at both ends of the components are arranged in a normal direction with respect to the plane S0 of the substrate. That is, when viewed from the normal direction with respect to the plane S0, the terminal of one end portion of the chip components 71 and 72 at least partially overlaps the terminal of the other end portion.

Further, terminals 71T and 72T at one end are exposed in a protruding state from the sealing resin portion 4. In addition to the bottom surfaces, the side surfaces of the terminals 71T and 72T are also exposed. The other terminals different from the terminals 71T and 72T are connected to the electrode of the module board 6.

Other configurations are the same as the configurations shown in the first embodiment. As described above, the component included in the electronic component module 103 may have a structure in which the terminals 71T and 72T of the chip components 71 and 72 having terminals disposed at both ends thereof are exposed in a state of protruding from the sealing resin portion 4. In addition, by controlling the height (protrusion amount) of the exposed portions of the side surfaces of the terminals 71T and 72T in this manner, it is possible to control the amount of solder wetting, for example, when the electronic component module 103 is solder-mounted on the mounting substrate.

Fourth Embodiment

In the fourth embodiment, an electronic component module in which an end portion including a terminal of a chip component of a land grid array type is exposed in a state of protruding from a sealing resin portion will be exemplified. Further, an electronic component module including a module component will also be exemplified.

Figure 8:
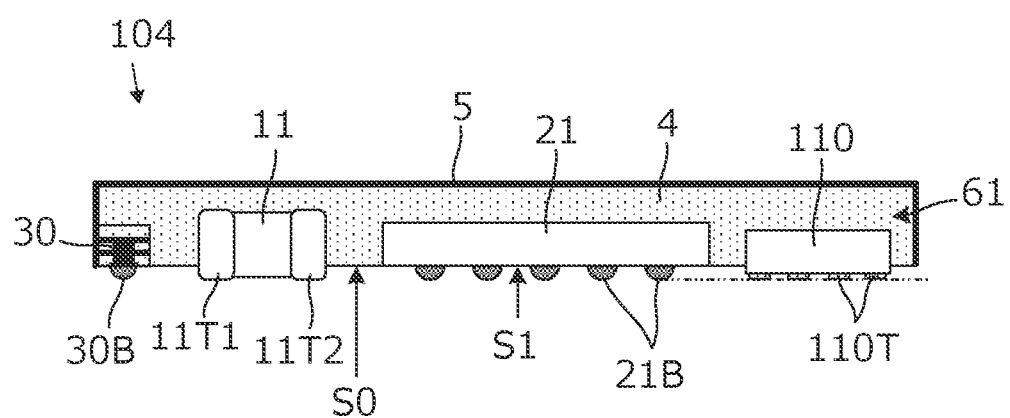
FIG. 8 is a front cross-sectional view of an electronic component module 104 according to a fourth embodiment.

FIG. 8 is a front cross-sectional view of an electronic component module 104 according to the fourth embodiment. The electronic component module 104 includes a plurality of components each having a terminal, the sealing resin portion 4 that covers and seals the components, and the shield layer 5 that covers an outer surface of the sealing resin portion 4.

As illustrated in FIG. 8, an electronic component module 104 according to the fourth embodiment is different from the electronic component modules 102 and 103 according to the second embodiment and the third embodiment in that a chip component 110 is provided. Other configurations of the electronic component module 104 are similar to those of the electronic component modules 102 and 103, and description of the similar parts will be omitted.

The chip component 110 includes a plurality of terminal electrodes 110T disposed on a bottom surface of the main body (component main body). The plurality of terminal electrodes 110T are made of, for example, copper, and have a configuration in which plating or the like is applied to surfaces thereof. That is, unlike solder bumps, the plurality of terminal electrodes 110T are not melted to become a conductive bonding material, but are bonded to another substrate by a different conductive bonding material.

The end portion of the main body of the chip component 110 including the bottom surface on which the plurality of terminal electrodes 110T are provided protrudes from the sealing resin portion 4. This protrusion allows tips of the plurality of terminal electrodes 110T to be flush with a tip of the bump 21B of the bump component 21.

With such a configuration, the electronic component module 104 can provide the same functions and effects as those of the electronic component modules 101, 102, and 103 of the above-described respective embodiments.

Finally, the present disclosure is not limited to the above-described embodiment. Modifications and alterations can be appropriately made by those skilled in the art. The scope of the present disclosure is defined not by the above-described embodiment but by the claims. Furthermore, the scope of the present disclosure includes modifications and alterations from the embodiment within the scope equivalent to the claims.

CS copper foil layer
RL insulator layer
S0 plane
S1 bump forming surface
V via conductor
1 mounting substrate
4 sealing resin portion
4S sealing resin layer
5 shield layer
6 module board
6B solder bump
8 adhesive sheet
8A adhesive layer
8B base material
11 to 19 chip component
11T1, 11T2 terminal
21, 22 bump component
21B solder bump
30 conductive component
30B solder bump
60 sealing resin
61, 62 module component
71, 72 chip component
71T, 72T terminal
101, 102, 103, 104 electronic component module
110 electronic component module
110T terminal

The invention claimed is:

1. An electronic component module comprising: a plurality of components having terminals and arranged along a plane; a sealing resin portion covering and sealing the plurality of components and having the plane as one plane of an outer surface; and a shield layer covering the outer surface of the sealing resin portion, wherein the plurality of components include a chip component, the chip component includes at least one terminal of the terminals at at least one end portion of a main body having a rectangular parallelepiped shape, at least a part of the at least one end portion including the at least one terminal protrudes from the sealing resin portion, and at least a part of the at least one terminal at the end portion protruding from the plane of the sealing resin portion is provided as a mounting terminal of the electronic component module, wherein the terminals are provided on five surfaces of the end portion protruding from the sealing resin portion of the chip component.

2. The electronic component module according to claim 1, wherein the sealing resin portion contains an inorganic oxide.

3. The electronic component module according to claim 1, wherein the plane is a rectangle, and when the rectangle is divided into four equal parts laterally and longitudinally, some of the terminals of the plurality of components exist in at least three of the divided parts.

4. The electronic component module according to claim 1, wherein the plurality of components include a bump component having a plurality of bumps as the terminals provided on one surface.

5. The electronic component module according to claim 1, wherein the at least one terminal includes a first terminal and a second terminal each including at least one electrode provided at each of two opposing end portions of the main body, and at least a part of the first terminal and the second terminal protrudes from the sealing resin portion by at least a part of the two opposing end portions protruding from the sealing resin portion.

6. The electronic component module according to claim 1, wherein the at least one terminal of one end portion of the chip component at least partially overlaps the at least one terminal of the other end portion when viewed from a normal direction with respect to the plane.

7. The electronic component module according to claim 1, wherein the plurality of components includes a module component configured by a module board and a component mounted on the module board.

8. The electronic component module according to claim 1, wherein the plurality of components include a conductive component electrically connected to the shield layer.

9. The electronic component module according to claim 2, wherein the plane is a rectangle, and when the rectangle is divided into four equal parts laterally and longitudinally, some of the terminals of the plurality of components exist in at least three of the divided parts.

10. The electronic component module according to claim 2, wherein the plurality of components include a bump component having a plurality of bumps as the terminals provided on one surface.

11. The electronic component module according to claim 3, wherein the plurality of components include a bump component having a plurality of bumps as the terminals provided on one surface.

12. The electronic component module according to claim 2, wherein the at least one terminal includes a first terminal and a second terminal each including at least one electrode provided at each of two opposing end portions of the main body, and at least a part of the first terminal and the second terminal protrudes from the sealing resin portion by at least a part of the two opposing end portions protruding from the sealing resin portion.

* * * * *

UNITED STATES PATENT AND TRADEMARK OFFICE
CERTIFICATE OF CORRECTION

PATENT NO. : 12,267,964 B2
APPLICATION NO. : 18/184728
DATED : April 1, 2025
INVENTOR(S) : Toru Komatsu and Tadashi Nomura Page 1 of 1

It is certified that error appears in the above-identified patent and that said Letters Patent is hereby corrected as shown below:

In the Specification

Column 2, Line 9:
"amounting terminal of the" should be --a mounting terminal of the--.

Column 3, Line 23:
"along line X-X in FIG. TA." should be --along line X-X in FIG. 1A.--.

Signed and Sealed this
Twentieth Day of May, 2025

Coke Morgan Stewart
*Acting Director of the United States Patent and Trademark Office*